United States Patent
Chen

(10) Patent No.: US 7,582,413 B2
(45) Date of Patent: Sep. 1, 2009

(54) SUBSTRATE, METHOD OF EXPOSING A SUBSTRATE, MACHINE READABLE MEDIUM

(75) Inventor: Alek Chi-Heng Chen, Xindian (TW)

(73) Assignee: ASML Netherlands B.V., Veldhoven (NL)

( * ) Notice: Subject to any disclaimer, the term of this patent is extended or adjusted under 35 U.S.C. 154(b) by 694 days.

(21) Appl. No.: 11/234,399

(22) Filed: Sep. 26, 2005

(65) Prior Publication Data

US 2007/0072133 A1 Mar. 29, 2007

(51) Int. Cl.
G03F 7/00 (2006.01)
(52) U.S. Cl. .................. 430/322; 430/312; 430/316; 430/317; 430/394; 430/15
(58) Field of Classification Search ........... 430/322, 430/312, 394, 316, 317
See application file for complete search history.

(56) References Cited

U.S. PATENT DOCUMENTS

| | | | |
|---|---|---|---|
| 5,716,758 A | 2/1998 | Bae et al. | |
| 6,042,998 A | 3/2000 | Brueck et al. | |
| 6,107,006 A * | 8/2000 | Chang | 430/322 |
| 6,589,713 B1 * | 7/2003 | Okoroanyanwu | 430/313 |
| 2004/0009434 A1 | 1/2004 | Lin et al. | |
| 2004/0180297 A1 | 9/2004 | Yoon et al. | |
| 2004/0197676 A1 | 10/2004 | Rau | |
| 2005/0025541 A1 | 2/2005 | Terae et al. | |
| 2007/0072097 A1 | 3/2007 | Chen | |

FOREIGN PATENT DOCUMENTS

| JP | 1-191130 A | 8/1989 |
|---|---|---|
| JP | 02-079045 | 3/1990 |
| JP | 05-275316 | 10/1993 |
| JP | 2000-194141 A | 7/2000 |
| JP | 2001-33984 A | 2/2001 |
| JP | 2002-075857 | 3/2002 |
| JP | 2003-233197 A | 8/2003 |
| JP | 2007-235485 A | 9/2007 |

(Continued)

OTHER PUBLICATIONS

European Search Report for Appln. No. EP 06 25 4878 mailed Jul. 18, 2008, 4 pgs.

(Continued)

Primary Examiner—Mark F Huff
Assistant Examiner—Caleen O Sullivan
(74) Attorney, Agent, or Firm—Sterne, Kessler, Goldstein & Fox P.L.L.C.

(57) ABSTRACT

A double exposure method for enhancing the image resolution in a lithographic system, is presented herein. The invention comprises decomposing a desired pattern to be printed on the substrate into at least two constituent sub-patterns that are capable of being optically resolved by the lithographic system, coating the substrate with a first positive tone resist layer and a thin second positive tone resist layer on top of a target layer which is to be patterned with the desired dense line pattern. The second resist material is absorbing exposure radiation during a first patterning exposure and after development during a second patterning exposure to prevent exposure above energy-to-clear of at least a portion of the first resist material underneath exposed portions of the second resist material layer.

11 Claims, 8 Drawing Sheets

FOREIGN PATENT DOCUMENTS

WO     WO 2005/015312 A2     2/2005

OTHER PUBLICATIONS

Lin, "Portable Conformable Mask. OA Hybrid Near-Ultraviolet and Deep-Ultraviolet Patterning Technique," Selected Papers on Optical Microlithography, Bellingham, Jan. 1, 1992, pp. 18-24.

Lin et al., "Portable Conformable mask-a hybrid near-ultraviolet and deep-ultraviolet patterning technique", Developments in Semiconductor Microlithography, proceedings of the SPIE, 1979, vol. 174, pp. 114-121.

English Abstract for JP 1-191130 A published Aug. 1, 1989, 2 pgs.

English Abstract for JP 2000-194141 A published Jul. 14, 2000, 1 pg.

English Abstract for JP 2001-033984 A published Feb. 9, 2001, 2 pgs.

English Abstract for JP 2003-233197 A published Aug. 22, 2003, 1 pg.

English Abstract for JP 2007-235485 A published Sep. 13, 2007, 1 pg.

Japanese Office Action issued for Patent Application No. 2006-257086, dated Mar. 2, 2007.

* cited by examiner

SUBSTRATE, METHOD OF EXPOSING A SUBSTRATE, MACHINE READABLE MEDIUM

BACKGROUND

1. Field of the Invention

The present invention generally relates to photolithography and associated methods and apparatus for exposing semiconductor substrates.

2. Description of Related Art

Lithographic exposure apparatuses can be used, for example, in the manufacture of integrated circuits (ICs). In such a case, a patterning device may generate a circuit pattern corresponding to an individual layer of the IC. In photolithography, a beam of radiation is patterned by having that beam traverse the patterning device, and is projected by a projection system of the lithographic apparatus onto a target portion (e.g., comprising one or more dies) on a substrate (silicon wafer) that has been coated with a layer of photo-activated resist (i.e., photoresist) material, such as to image the desired pattern in the resist. In general, a single wafer will contain a whole-network of adjacent target portions that are successively irradiated via the projection system, one at a time.

In the semiconductor industry, the continual demand for smaller semiconductor devices, having smaller patterns and features on the wafer substrate, is pushing the limits on the optical resolution that can be achieved by lithographic exposure apparatus. Generally, the smallest size of a repeatable feature (e.g., "half-pitch") of a pattern exposed on the wafer substrate that can be optically resolved by lithographic exposure apparatus, depends on attributes of the projection system and the (patterned) projection beam of radiation. In particular, the optical resolution for half-pitch feature size may be derived by using the simplified form of the Rayleigh resolution equation:

$$p_{0.5} = k_1 \cdot \lambda / NA, \text{ with } k_1 \geq 0.25 \quad (1)$$

where: p 0.5 represents the repeatable feature size (e.g., "half-pitch") in nm;

NA represents the numerical aperture of projection system;

represents the wavelength of projection beam, in nm; and $k_1$, is a factor representative for the achievable optical resolution limit for the half-pitch feature size.

As indicated above, the theoretical optical resolution half-pitch lower limit for $k_1$ is 0.25. In an attempt to approach the $k_1$=0.25 barrier, considerable efforts have been directed to develop expensive technologies that are capable of employing shorter wavelengths and/or higher numerical apertures, thus allowing production of smaller features while not violating the $k_1 \geq 0.25$ constraint. However, these technologies do not enable a circumvention of the $k_1$=0.25 barrier to arrive at effective values of the $k_1$ such that $k_1 < 0.25$.

For printing a dense pattern of lines and spaces (i.e., providing lines of hard mask material that serve as etch stop, with spaces in between allowing for etching of a target layer underneath the hard mask) where the lines occur at a pitch p, it is known that circumvention of the $k_1$=0.25 barrier is possible by applying a double exposure lithographic process, whereby a desired pattern of dense lines and spaces to be printed is decomposed into two constituent sub-patterns of trenches (arranged at a pitch $2p$) that are capable of being optically resolved by the lithographic system. A Si wafer is coated with a $SiO_2$ film serving as hard mask, and the $SiO_2$ film is coated with a negative tone photoresist material layer. By exposure to an image where trenches appear as dark lines arranged at a pitch $2p$ on a bright background, and a subsequent development of the resist material, a first resist mask comprising trenches at a pitch $2p$ is provided on the $SiO_2$ film. By a subsequent etching of the a $SiO_2$ film and a stripping of the resist the first sub pattern of trenches is transferred to the $SiO_2$ film. Next, the process of applying negative tone resist material, exposing, developing and etching is repeated with a second sub-pattern of trenches, which may correspond to the first sub-pattern of trenches off-set by a half-pitch distance thereby interlacing new trenches between the previously defined trenches. As a result, the first and second sub-pattern images are combined to produce the desired pattern in the $SiO_2$ film on the target layer, whereby the trenches are the spaces between the lines. Here the need for two etching steps to transfer the final desired pattern to a hard mask reduces the throughput of the lithographic process with respect to a single exposure process unless additional etch capacity at additional cost is provided.

SUMMARY

Embodiments of the present invention may be used to ameliorate a lithographic multiple exposure process. A method consistent with the principles of the present invention, as embodied and broadly described herein, provide for the enhancement of image resolution in a lithographic system.

There is provided a substrate comprising a target layer constructed and arranged to be lithographically patterned, using radiation, with a desired pattern comprising a first sub pattern and a second sub pattern, whereon is provided a first layer of a first positive tone developable material at least partially overlying the target layer, and a second layer of a second positive tone developable material with a preselected absorbance for the radiation and at least partially overlying the first layer, wherein said absorbance is arranged to prevent exposure to above energy-to-clear exposure dose of at least a portion of the first positive tone developable material underneath portions of the second positive tone developable material when said portions are exposed to the radiation.

According to an aspect of the invention there is provided a method of exposing a lithographic substrate to radiation, said substrate having a first layer of a first positive tone developable material at least partially overlying the substrate and a second layer of a second positive tone developable material with a preselected absorbance for the radiation and at least partially overlying the first layer, including patterning the second layer with features of the second positive tone developable material in accordance with a first pattern of the radiation by exposing the second layer to the first pattern of the radiation, and developing the second positive tone developable material, exposing the first layer and said features to a second pattern of the radiation whereby one or more areas of exposure of the second pattern comprise one or more of said features, and whereby during the respective exposures of the second and first layers said absorbance prevents exposure to above energy-to-clear exposure dose of at least a portion of the first positive tone developable material underneath exposed portions of the second positive tone developable material.

According to another aspect of the invention there is provided a machine readable medium encoded with machine executable instructions for patterning a substrate according to an exposure method using patterned radiation and including providing to a spin-coat device a substrate having a target layer constructed and arranged to be lithographically patterned with a desired pattern comprising a first sub pattern and a second sub pattern, and having a first layer of a positive tone resist material at least partially overlying the target layer, obtaining data for determining an absorbance of a second layer of a positive tone developable material to be disposed on the first layer, determining a thickness of the second layer based on said data and in accordance with the absorbance preventing exposure to above energy-to-clear exposure dose of at least a portion of the positive tone resist material underneath exposed portions of the positive tone developable material, determining settings for the spin-coat device based on the determined thickness, applying the settings and providing the second layer to the first layer, exposing the substrate to a first pattern of the radiation in accordance with the first sub pattern, developing the positive tone developable material, exposing the substrate to a second pattern of the radiation in accordance with the second sub pattern, and developing the positive tone resist.

According to another aspect of the invention there is provided a lithographic system including a lithographic exposure apparatus, a spin-coat device capable of providing a layer of developable material to a substrate, and a control device for controlling the lithographic exposure apparatus and spin-coat device, whereby the control device is arranged to execute the method of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1:
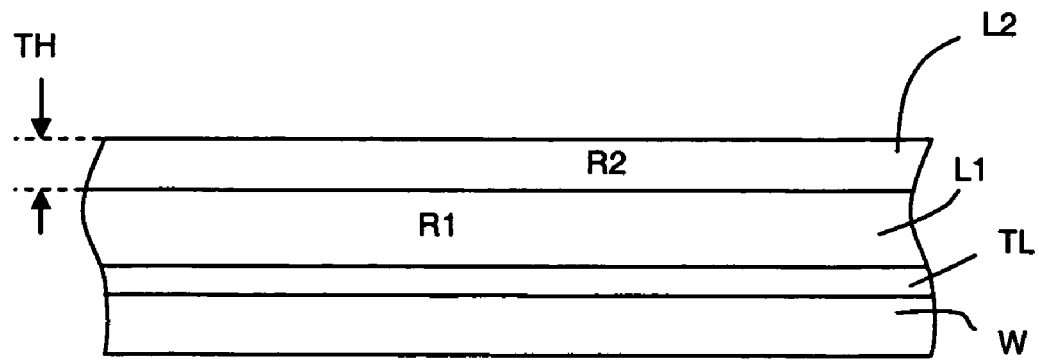
FIG. 1 illustrates a substrate prepared for use with the method, provided with a target layer and two resist layers.

As noted above, their exists a constant need to achieve finer optical resolutions and circumventing the theoretical half-pitch lower limit $k_1$ of 0.25 for printing lines using a double exposure process whereby avoiding the use of an intermediate etching step in between the two exposures would provide an important advantage.

As described in greater detail below, the present invention achieves resolutions lower than the half-pitch lower limit half pitch $p_{0.5} = k_1 \cdot \lambda / NA$ whereby $k_1 \geq 0.25$, thus circumvention the $k_1 = 0.25$ barrier, by implementing a dual exposure technique whereby use is made of a specially designed sandwich photoresist structure comprising a resist layer which substantially absorbs the exposure radiation. Further, the present invention enables the exclusive use of positive tone resist for printing features whereby the use of positive tone resist is preferable over the use of negative tone resist, and whereby $k_1 < 0.25$. Examples of such features are dense, semi dense and isolated lines whereby $k_1 < 0.25$.

In the manufacture of integrated circuits (ICs) lithographic exposure apparatuses are used, in which case a patterning device such as a mask (a "reticle") generates a circuit pattern corresponding to an individual layer of the IC. In photolithography, a beam of radiation is patterned by having that beam traverse the reticle. Subsequently, the patterned radiation beam is projected by a projection system of the lithographic apparatus onto a target portion (e.g., comprising one or more dies) on a substrate (such as, for example, a silicon wafer) that has been coated with a layer of photoresist material. An image of the desired pattern is formed by the projection system, and the resist material is exposed to patterned radiation constituting said image. In general, a single wafer will contain a whole network of adjacent target portions that are successively irradiated via the projection system, one at a time. The patterned radiation provides a pattern of bright, exposed areas and dark ideally unexposed but in practice substantially unexposed areas at wafer level. The resist material layer facing the exposure radiation is exposed to such a radiation pattern, and a photo active compound in the resist is, in the bright areas and due to the exposure to radiation, changing the solubility of the resist in developer (generally a resist developer is a basic, aqueous solution). This change of solubility from insoluble to soluble in a positive tone resist (and from soluble to insoluble in a negative tone resist) occurs at a threshold value of the exposure dose, the so called energy-to-clear, hereinafter denoted by Eo. In order to decrease the printable half pitch of dense features, the wavelength of the radiation used for exposure is chosen as small as possible (in accordance with Equation 1). Radiation sources generally used for projection lithography are i-line mercury arc lamps, KrF excimer lasers and ArF excimer lasers, providing radiation with a spectral peak at a wavelength of respectively 365 nm, 248 nm and 193 nm. Along with the introduction of new radiation sources (operating at shorter wavelengths), substantially non-absorbing resists had to be developed for each of these radiation wavelengths, since any substantial absorption of exposure radiation in a resist material layer would prevent the radiation from activating the photo-active compound of the resist material over the whole depth of the resist material layer. For example, when positive tone resist material is used, absorption of exposure radiation could cause an incomplete developing of an exposed area, leaving residual unexposed resist material in this area after the development of the resist. Due to conflicting requirements imposed on the resist material, this problem cannot be solved by merely reducing the thickness of the resist material layer. In particular, such a reduction of thickness may be in conflict with the requirement that the resist layer preferably has sufficient thickness in order to have sufficient etch resistance to enable functioning as an etch-mask for patterning of the layer underneath the resist by etching. Therefore, substantially non-absorbing resists have been developed for use with radiation as provided by mercury-arc lamps and excimer lasers. For i-line lithography diazonaphthoquinone based resist materials are commonly used. These resists cannot be used with KrF lithography because of strong absorption of radiation of 248 nm wavelength in a layer of diazonaphthoquinone based resist material at sufficient thickness for etch resistance. With the transition to KrF lithography whereby lithography apparatus are used at 248 nm wavelength, chemically amplified resist materials came into use. A chemically amplified resist material features a sufficiently low absorbance for 248 nm radiation. A critical component of chemically amplified resist materials is the photo-acid generator (referred to as PAG), which is the photo-active ingredient. The PAG produces acid upon irradiation. However, in order to achieve sufficient transmittance for radiation of 193 nm wavelength (to enable the use of the chemically amplified resist materials with ArF lithography) new PAG's, such as for example ionic PAG, were introduced and are still in development to further lower the absorbance of a corresponding resist layer at 193 nm radiation-wavelength. A resist type for use with a specific radiation source and with an absorbance beyond tolerance when used with a radiation source operating at a shorter wavelength than said specific radiation source (examples of which are given above) will be referred to hereinafter by the specific radiation source with which it is to be used: thus, in the present text and claims reference may be made to i-line resist, KrF resist and ArF resist.

According to a first embodiment of the invention, and as illustrated in FIG. 1, there is provided a substrate W, which may carry previously processed IC layers, and which is provided, in the following order, with a target layer TL, a first resist material layer L1 comprising a first resist material R1, having an energy-to-clear Eo and overlaying the target layer TL, and a second resist material layer L2 comprising a second resist material R2 and overlying the first resist layer L1. Providing the resist material layers may include, according to the present invention, applying pre-exposure processes such as for example cleaning, priming and soft-bake processes. To reduce back reflection of exposure radiation during exposure, the second resist material layer L2 may further include a Developable Bottom Anti Reflex Coating to reduce back reflection of exposure radiation, and the first resist material layer L1 may further include a Bottom Anti Reflex Coating or a Developable Bottom Anti Reflex Coating. Both resist layers L1 and L2 are to be exposed with radiation of one single type of radiation source. In the present embodiment, the double exposure process is executed using a lithographic exposure apparatus comprising an ArF excimer laser as radiation source, the first resist material R1 is an ArF resist, and the second resist material is a KrF resist.

The thickness of the first resist layer L1 is such that, after exposure (to a pattern of radiation as projected on the resist layer L1) and development, it can serve as an etch mask for transfer of the pattern in the developed resist layer to the target layer TL by means of dry etching. According to the present invention there is no requirement that the resist material layer L2 shall function as an etch-mask. Instead, the thickness TH of the second resist material layer L2 is merely chosen such that it is photoactivated throughout its thickness in exposed areas, whilst at the same time preventing exposure of the first resist R1 to an exposure dose greater than the energy-to-clear Eo. The resist material R2 being, in the present embodiment, a KrF resist; strong absorption of ArF excimer laser radiation will occur upon exposure, so that—in the absence of the conventional etch-mask function of patterned resist layers—the thickness TH typically can be chosen smaller than the thickness of the resist material layer L1.

According to an aspect of the invention, and in view of the fact that with the present invention there is no requirement that the patterned resist material layer L2 shall function as an etch-mask, the material of layer L2 can be any suitable positive tone developable material which provides the layer L2 with the desired absorbance.

Figure 2:
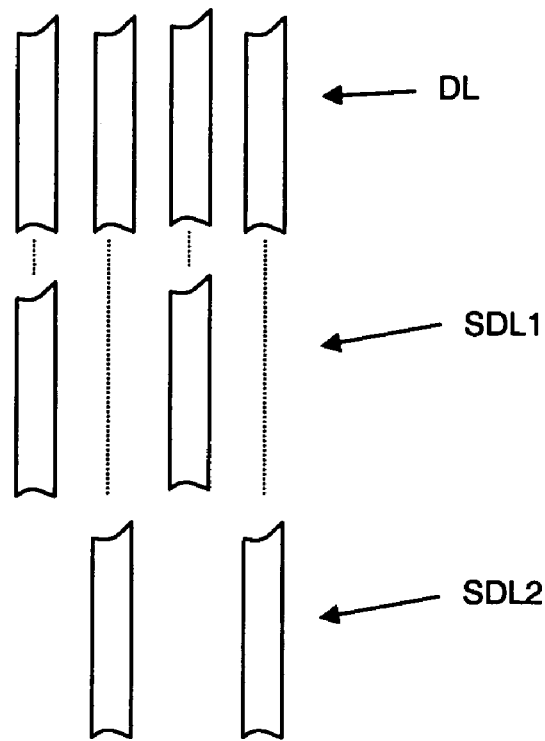
FIG. 2 illustrates the decomposition of a dense line pattern which is beyond lithographic resolution into two semi dense line patterns which each are within lithographic resolution.

As schematically illustrated in FIG. 2, the desired pattern to be printed, using a lithographic exposure apparatus, comprises a set DL of dense lines. This set DL is decomposed into two constituent sub-patterns SDL1 and SDL2 of semi-dense lines that are capable of being optically resolved by the lithographic apparatus.

After providing the substrate to a lithographic projection apparatus, the substrate is subjected to a first exposure process whereby the second resist material layer L2 is exposed to a first pattern of radiation corresponding to the sub-pattern SDL1.

Figure 3:
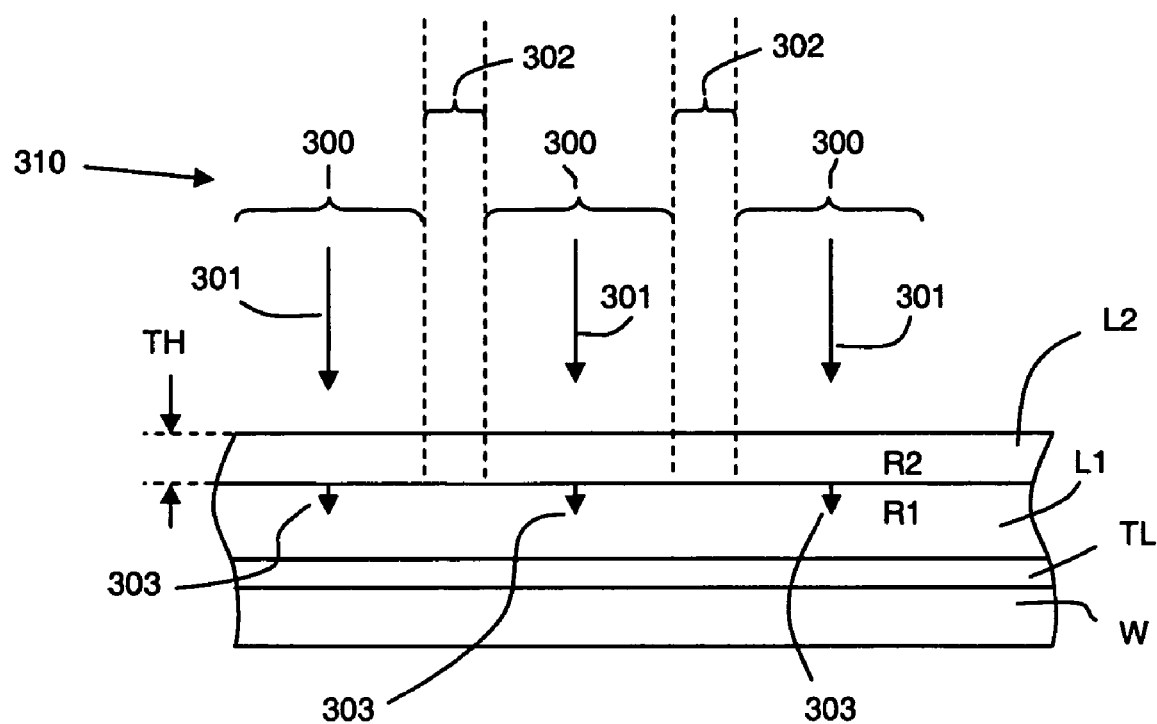
FIG. 3 illustrates the first exposure to a first radiation pattern representing semi dense dark lines and bright spaces according to the present invention.

As illustrated in FIG. 3, the first pattern of radiation 310, in accordance with the first sub-pattern SDL1, comprises areas of exposure 300, whereby the length of the arrows 301 schematically indicates the magnitude of the exposure dose $E_{in}$, applied to the second resist material layer L2 in these areas. The pattern further comprises unexposed areas 302 corresponding to lines of the first sub-pattern SDL1. Due to absorption of exposure radiation in the second resist material layer L2, exposure of the first resist R1 to an exposure dose greater than the energy-to-clear Eo is avoided. The resist layer L1 underneath the areas of exposure 300 will in principle be exposed to an exposure dose which is leaking through the absorbing second resist material layer L2 during exposure. This exposure dose is referred to as the leakage dose, and is denoted by $E_{out}$. The leakage of exposure dose is schematically indicated by the arrows 303 in FIG. 3; the length of the arrows 303 schematically indicates the magnitude of the leakage dose $E_{out}$. The leakage dose $E_{out}$ leaking through layer L2 is related to the exposure dose $E_{in}$ of the first exposure according to:

$$E_{out}=E_{in} \cdot 10^{-A}, \quad (2)$$

where A is the absorbance of the second layer L2. Hence, if Ao is the absorbance of the layer L2 at which $E_{out}$=Eo, thus when the equation $$Eo=E_{in} \cdot 10^{-Ao} \quad (3)$$

is satisfied, then the thickness of the second layer is to be chosen such that A>Ao. The absorbance A of the second resist layer L2 is to good approximation linearly proportional to the thickness TH. For example, the absorbance may be modeled as follows:

$$A=\epsilon THc \quad (4)$$

where $\epsilon$ is the molar absorptivity of the PAG, and c the concentration of the PAG.

Figure 4:
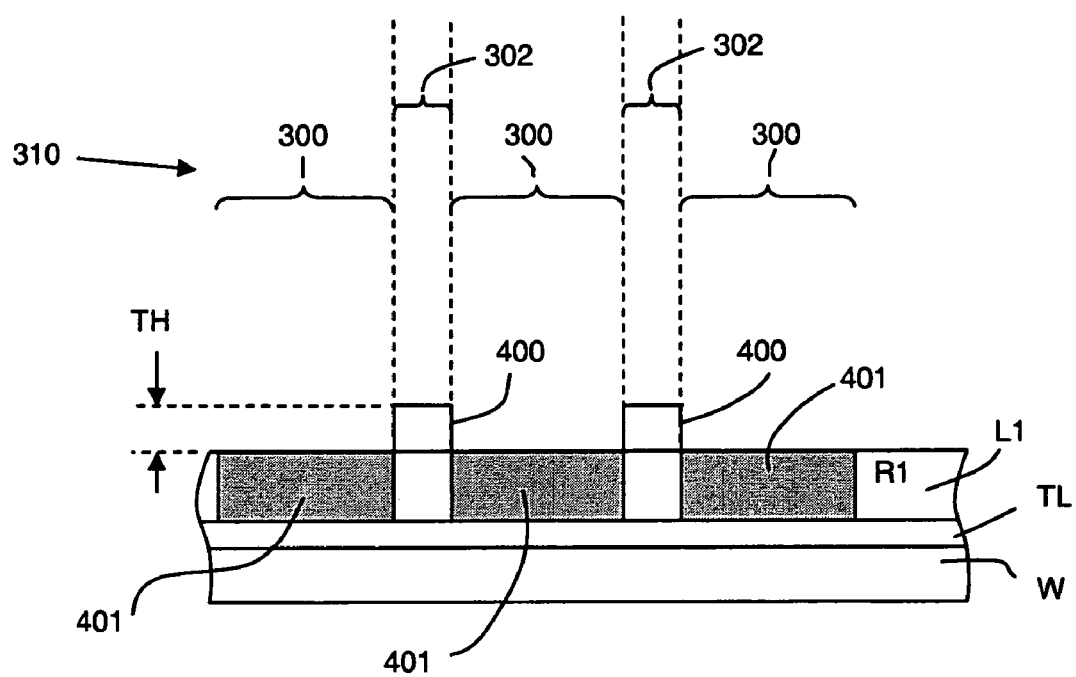
FIG. 4 illustrates the effect of the first exposure and a subsequent development of resist.

In the present embodiment, after the first exposure, the exposed resist material R2 is removed by a first resist development process. As schematically illustrated in FIG. 4, unexposed resist material R2 remains and hence a mask of line shaped features 400 of resist material R2 corresponding to the lines of the first sub pattern SDL1 is obtained on the resist material layer L1. After applying the first exposure and before applying the first resist development process, the substrate may or may not (depending on the material properties of the resist material R2) be subjected to post-exposure processes such as for example a Post Exposure Bake (PEB) and a hard bake. If the substrate is subjected to, for example, a Post Exposure Bake (PEB) and/or a hard bake, an effect of these steps on the resist material R1 may be compensated by adjusting the exposure dose of a second exposure (described below). The spaces between the semi dense lines 400 of unexposed resist material R2 define areas 401 in the resist material layer L1 where the resist material R1 has been exposed to the leakage dose $E_{out}$ (an exposure dose below energy-to-clear Eo). The below energy-to-clear exposure of the areas 401 is indicated in FIG. 4 by the grey filling of the areas 401. Thus, after the first exposure, the resist material R1 has either been exposed below Energy-to-clear, or it has not been exposed (ignoring any insubstantial exposure such as exposure to stray radiation).

Figure 5:
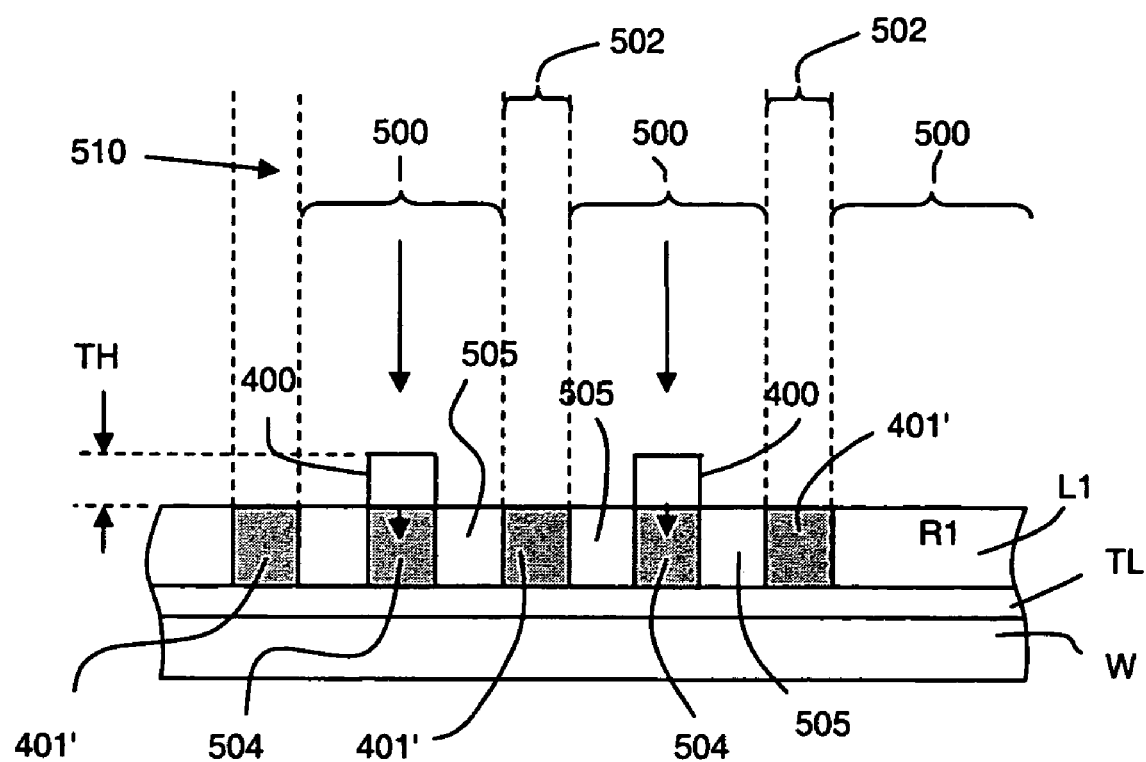
FIG. 5 illustrates the second exposure to a radiation pattern representing, in interlaced position with respect to the first radiation pattern, semi dense dark lines and bright spaces according to the present invention.

According to the present embodiment, and as illustrated in FIG. 5, the first resist material layer L1 and the line shaped features 400 of unexposed resist material R2 are exposed, during a second exposure process, to a pattern 510 of ArF excimer laser exposure radiation in accordance with the second sub pattern SDL2, comprising dark semi dense lines 502 embedded in bright background areas of exposure 500. The lines of the pattern SDL2 are positioned in between the previously obtained line features 400. In the areas corresponding to the bright spaces 500 between the dark lines 502 of the second exposure radiation pattern 510 the absorbance of the KrF resist features 400 prevents exposure of resist material R1 underneath these features to a dose above energy-to-clear Eo. The process of exposure dose leaking through the KrF resist material features 400 is the same as the exposure dose leakage process during the first exposure, i.e., it is governed by the same physical conditions such as Equations 1-4. This is schematically indicated by the larger and smaller vertical arrows in FIG. 5, corresponding to the respective arrows 301 and 303 in FIG. 3. Thus, the resulting exposure of the resist material R1 underneath the features 400 is substantially the same as the below energy-to-clear exposure to radiation that had occurred before start of the second exposure in the dark areas 502. In analogy with the areas 401, this is indicated by the grey filled areas 401' (corresponding to the dark lines 502) and 504 (underneath the features 400) in FIG. 5. The resist layer material R1 is fully exposed to an exposure dose $E_{in}$ in the areas 505 between the areas 401' and 504.

Figure 6:
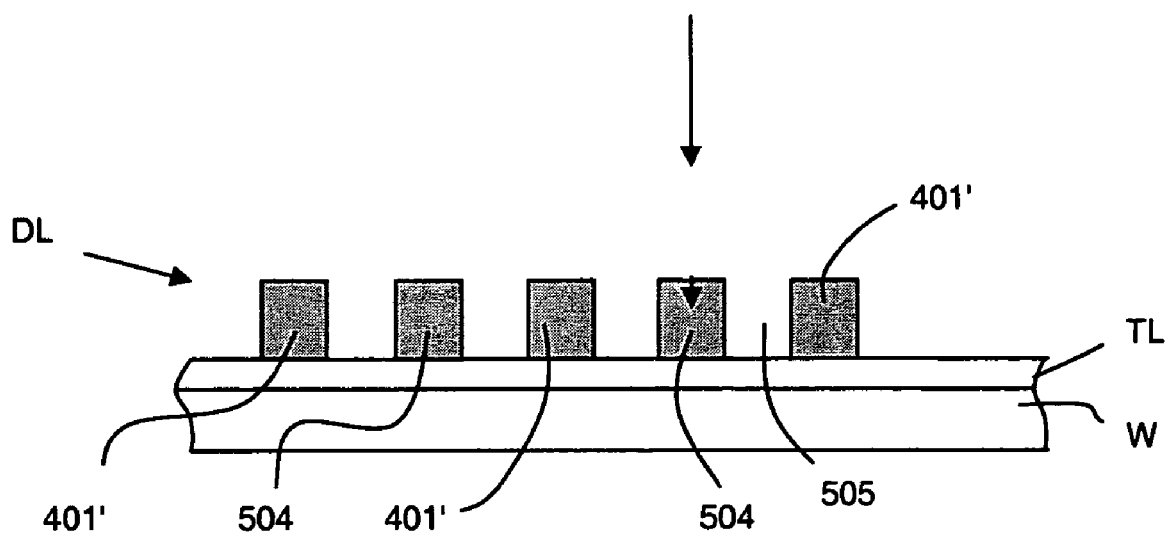
FIG. 6 shows a resist mask in accordance with a desired dense pattern of lines and spaces according to the invention.

In the present embodiment, after the second exposure, the resist material features 400 and the exposed resist material R1 in the areas 505 is removed by applying a second resist development process. Unexposed resist material R1 and/or resist material R1 exposed below energy-to-clear Eo remains and hence, on the target layer TL an etch-mask of line shaped features of resist material R1 corresponding to the lines of the desired pattern DL is obtained, as indicated in FIG. 6. After the second exposure, the substrate may again be subjected to post-exposure processes such as for example a Post Exposure Bake (PEB) and a hard bake.

The pattern of resist material features can be used as etch-mask for the transfer of the desired pattern DL to the target layer using for example conventional reactive ion etching. Such a final transfer of the pattern to the target layer TL may, for example, involve an etching using a dry etching chamber, suitable for reactive ion etching. An advantage of Reactive Ion Etching, also referred to as RIE, is that it is a non-isotropic, directionally selective etch process, whereas wet etching is an isotropic etch process (causing undercut of features).

As further illustrated in FIG. 6 by the similar grey filling of the areas 401' and 504, the exposure to radiation (below energy-to-clear) of the resist features 600 is the same for the lines of the two sub patterns, provided that the exposure dose $E_{in}$ for the first and second exposure process is substantially the same. Hence, to the extent that exposure to such a below Eo exposure dose has any effect on etch resistance, such as for example an etching-bias, this effect is uniformly distributed over the lines of the mask pattern, thereby providing process uniformity.

According to an aspect of the invention, however, the leakage dose $E_{out}$ may exceed, in the first and second exposure of the present embodiment, the energy-to-clear dose Eo within tolerance. Consequently, during the two exposures a layer-shaped upper section of the first resist material layer L1 facing the exposure radiation is exposed above development threshold and will be developed away during the application of the respective first and second development processes. Due to residual absorption of exposure radiation in the ArF resist layer L1, the effect of exposure to above energy-to-clear exposure dose remains limited to said layer-shaped upper section, so that the absorbance A still prevents exposure to above energy-to-clear exposure dose of at least a portion of the first resist material R1 underneath exposed areas during exposing the second layer L2 and underneath said features 400 during exposing the first layer and said features 400. Since again both the exposure in said layer shaped upper section and in the portion of the resist material layer L1 underneath the upper section are governed by the same physical conditions during the two exposures, any effect on etch resistance, or on an etching-bias, is uniformly distributed over the lines of the mask pattern, thereby maintaining above mentioned process uniformity.

An aspect of the invention is that the method is suitable for printing dense and semi dense lines because the method involves the use of positive tone resist for the first and second exposure. An imaging process for printing lines is of optimal quality when imaging dark lines against a bright background. With the present invention this optimal quality can be obtained by using positive resist with the lithographic processes for printing the line features of the resist masks formed in the resist material layers L2 and L1.

The lithographic exposure apparatus used for printing the lines generally comprises a support structure constructed to support a patterning device (e.g., a mask), and a substrate table (e.g., a wafer table) constructed to hold the substrate W. The lithographic exposure apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. Residual placement errors during e-beam writing of the masks for the patterns SDL1 and SDL2 can be monitored and in a dual stage lithographic projection system these residual errors can be compensated for when the dual stage apparatus is used in a mode of operation whereby the scanner "remembers" the wafer chuck used for the $1^{st}$ exposure and dedicates the same wafer chuck for the second exposure. This mode of operation will be referred to hereinafter as the chuck-dedication-mode. As a result, in the chuck-dedication-mode, the wafer stepping grid and the wafer table chucking induced distortions fingerprints will be the same for the first and second exposures. This reduces non-correctable higher order overlay errors between these two exposures. In addition, the low order e-beam mask writer's pattern placement errors, e.g., linear offsets and magnification errors, between two masks can be compensated in the scanner by using the appropriate alignment compensations for the wafer stage and the reticle stage. In the chuck-dedication-mode the overlay performance with the present double exposure process is comparable to, or even better than the mask-writer's placement accuracy.

An aspect of the present invention is that lines are printed, instead of spaces. Alignment errors between the two exposures do not affect the resulting printed line width, but only the spaces between the lines, which is generally less critical to, for example, transistor performance. A placement error between the sub-patterns SDL1 and SDL2, i.e., the overlay consistency between the two exposures of the double exposure process, has no effect on the printed critical dimension of the resulting lines. This placement error can be of the order of the placement error as occurring during the mask writing process. By using positive resist with the lithographic processes for printing the lines of the patterns SDL1 and SDL2 any overlay error of the patterns SDL1 and SDL2, and hence also of the resulting pattern DL, with respect to a pattern which was previously formed on the substrate W is the same as would have been obtained with a single exposure process. In other words, the resulting alignment accuracy of the pattern DL in the target layer. TL with respect to a reference on the substrate W directly corresponds to the alignment accuracy obtainable with a single-exposure process.

Due to any non-linearity of the response of a photoresist layer to either development and/or exposure, the spatial Fourier transformation of the resist-mask of features 400 corresponding to the sub-pattern SDL1, contain higher spatial frequencies than the spatial Fourier transformation of the intensity pattern of the image of the sub-pattern SDL1. The first exposure and development of the resist R2 fixes the first sub-pattern image in the second resist material layer L2, and the features 400 of resist material R2 act as a contact mask during the second exposure, thus preventing a cross talk or a merging of the two sub-pattern images corresponding to the patterns SDL1 and SDL2. Therefore, also the spatial Fourier transformation of the combined pattern DL as transferred to the target layer (using the features 600 as etch-mask) contains spatial frequencies higher than corresponding to the inverse of a halfpitch $p_{0.5}=k_1 \cdot \lambda/NA$ whereby $k_1 \geq 0.25$, which enables the circumvention of the $k_1=0.25$ barrier.

According to an aspect of the invention the target layer TL may either be an IC-layer (such as for example a doped polysilicon layer) or a hard mask layer which is to act as an etch-mask.

According to the present invention neither a deposition of a hard mask layer nor an etching of a hard mask layer between the two exposures is needed. Instead, the present exposure and line printing method in principle only uses a conventional aqueous development steps, one between the two exposures, and one after the second exposure. Consequently, the present method can easily be implemented in a lithographic system comprising the lithographic apparatus and a coat/develop track that is typically linked to the lithographic apparatus.

Figure 7:
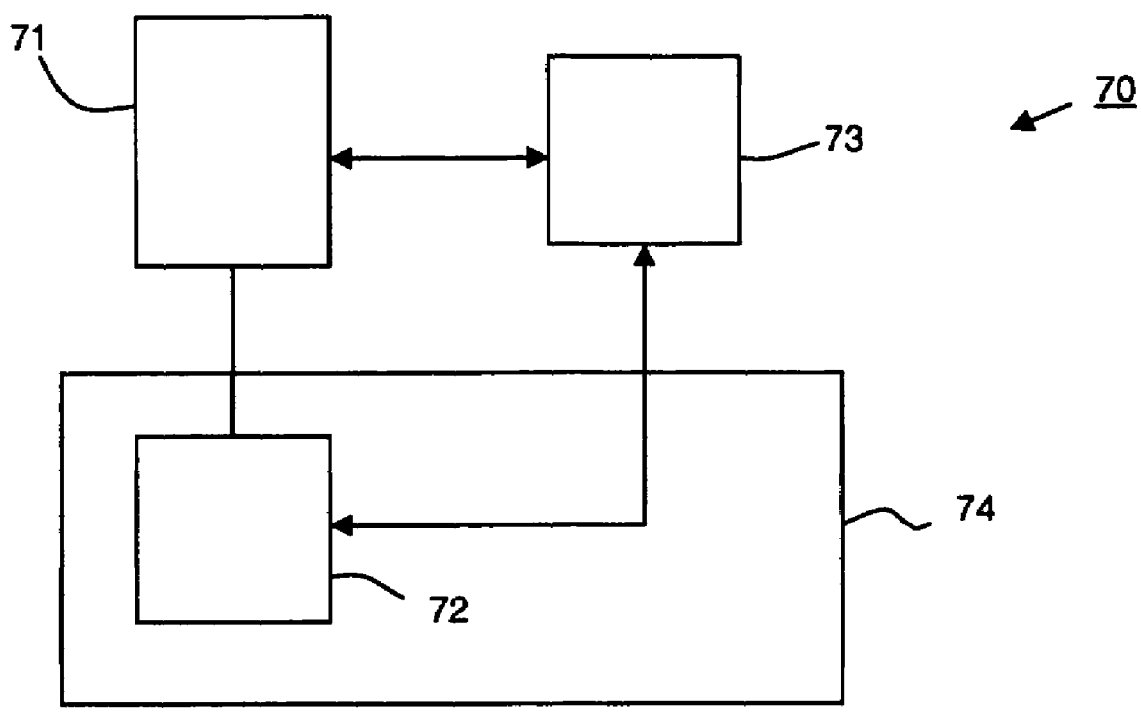
FIG. 7 illustrates a lithographic cluster according to the invention.

A lithographic system suitable for use with conventional double exposure processes generally comprises a plurality of resist development devices and substrate coating devices, such as a spin-coat device for applying a resist layer onto the substrate. According to an aspect of the present invention, and as illustrated in FIG. 7, a lithographic system 70 comprises, besides a lithographic exposure apparatus 71, a spin-coat device 72 capable of providing to the substrate the resist material layer L2, and a control device 73 for controlling the lithographic exposure apparatus and the spin-coat device. The spin-coat device may be arranged to provide a resist layer of a preselected thickness to the substrate, whereby this process is fully automated and run under computer control. The thickness of the resist layer as applied by the spin-coat device is controlled by a number of parameters comprising for example, the rotation speed used for spin-coating, the temperature of the resist material, the amount of resist material applied to the substrate W during spin-coating, and the viscosity of the resist material.

One or more spin-coat devices may be used to respectively apply the first and second resist material layers L1 and L2.

Figure 8:
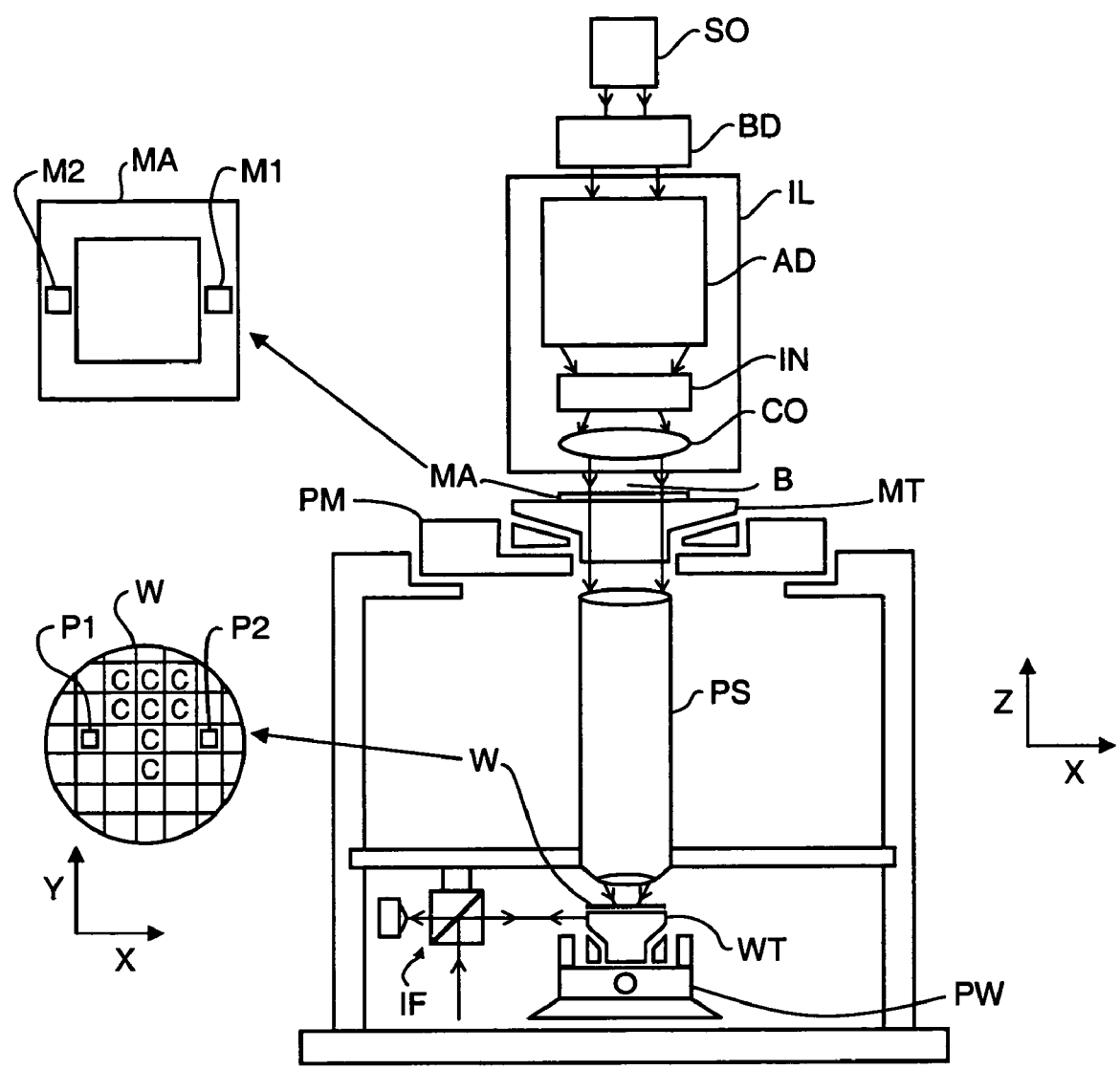
FIG. 8 depicts a lithographic apparatus-according to an embodiment of the invention.

A lithographic exposure apparatus according to an embodiment of the invention is schematically depicted in FIG. 8. The apparatus comprises:

an illumination system (illuminator) IL configured to condition a radiation beam B (e.g., UV radiation or DUV radiation such as for example generated by an excimer laser operating at a wavelength of 193 nm or 157 nm, or EUV radiation generated by a laser-fired plasma source operating at 13,6 nm).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 8, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 8) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an aspect of the invention the lithographic system comprises, as lithographic exposure apparatus, a lithographic interferometry apparatus. In such an apparatus, a resist layer is exposed to a fringe pattern obtained in a multiple beam interferometric apparatus. For example, two collimated beams of UV or DUV radiation intersect each other at an angle to produce linear interference fringes. A wafer having a photosensitive layer is positioned on a movable table. The table is arranged to be rotated and translated in two-dimensions respectively. Two substantially collimated coherent optical beams provided by any suitable well known source or sources are directed at a variable angle from the normal vector associated with the wafer toward each other and toward the photoresist layer to form an interference pattern on the photosensitive layer. The interfering radiation beams of coherent radiation may be generated by, for example, an ArF excimer laser using a beam splitting element, and may be provided in any suitable well known manner so that they are from the same source and are essentially equal in intensity at the wafer which assures a high contrast exposure.

The interference pattern produced on the photoresist layer or layers may be varied by for example rotating the wafer and/or translating the wafer.

The control device 73, see FIG. 7, according to the present invention may comprise a memory into which data can be stored which concern the sub-patterns SDL1 and SDL2 and which are used for controlling the lithographic exposure apparatus 71 (such as, for example, settings concerning positioning of the stages MT and WT, and/or settings concerning illumination modes) during each of the two exposures required to generate the combined pattern DL. The same memory can be used to store data concerning the settings of the spin-coat device 72 used for providing the second resist material layer L2 to the substrate W in accordance with the present invention. A computer which may be part of the control device is programmed and arranged to execute, based on the data stored in the memory, any of the method steps according to the present invention.

Figure 9:
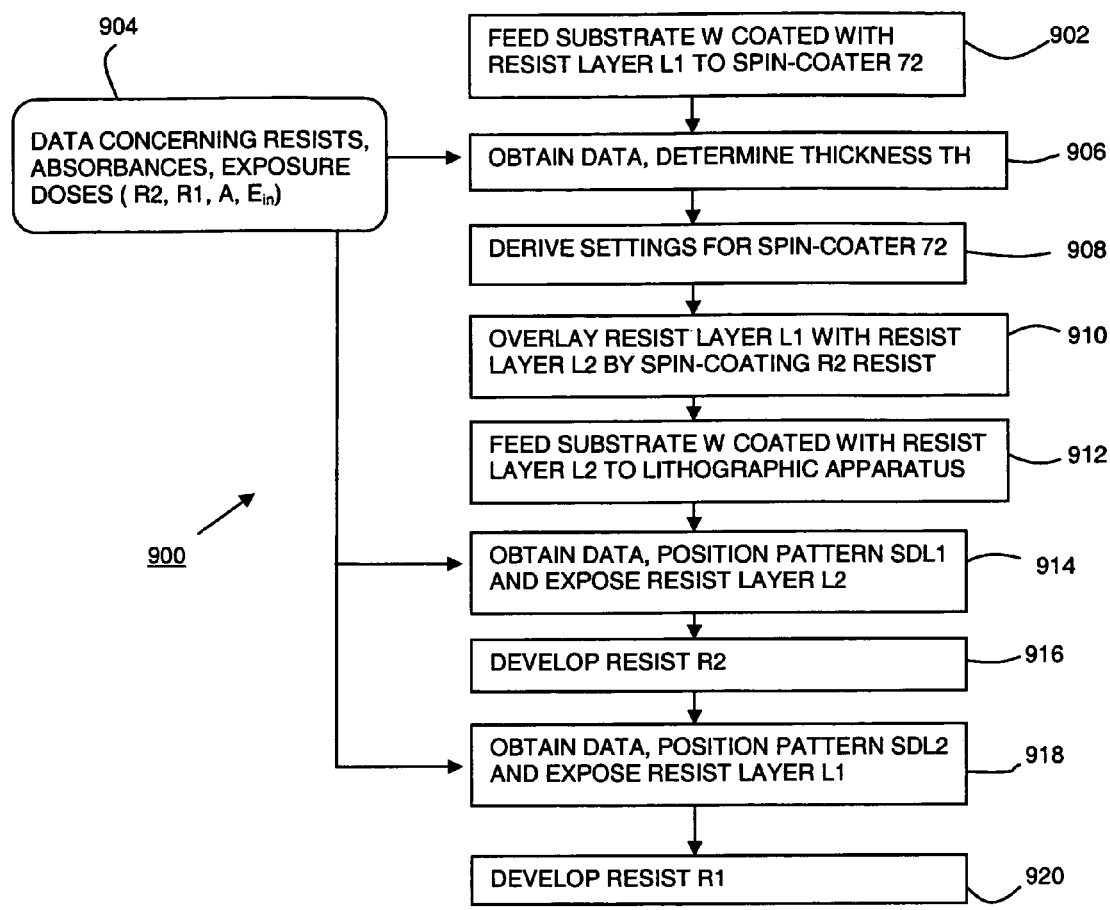
FIG. 9 shows a flow scheme of a double exposure method according to the present invention.

FIG. 9 illustrates the method steps 900 according to the invention. The execution of the steps involves running a computer program on said computer, said computer program containing one or more sequences of machine-readable instructions describing any of the methods as disclosed above. The computer contains a machine readable medium (e.g., semiconductor memory, magnetic or optical disk) having such a computer program stored therein.

According to an aspect of the invention the machine readable medium is encoded with machine executable instructions for patterning a substrate according to the steps 900. A substrate W provided with a target layer TL and the first resist material layer L1 is provided (step 902) to the spin-coat device, which may involve a substrate handler transporting the substrate from the lithographic exposure apparatus 71 to the spin-coat device 72. Next, in step 906, the required thickness TH of the second resist layer L2 such that the absorbance A prevents exposure to above energy-to-clear exposure dose Eo of at least a portion of the first resist R1 underneath exposed areas 301 during exposing the second layer L2 (and underneath the features 400 during exposing the first layer L1 carrying said features 400) is determined. To that purpose, data 904 comprising data concerning the resist materials R1 and R2, data concerning the respective absorbances such as for example parameters (the molar absorptivity of the PAG) and c (the concentration of the PAG), and data concerning the first and second exposure are obtained. The latter data may involve the properties of the patterns SDL1 and SDL2, such as for example the type of mask and a critical dimension bias, as well as exposure doses to be applied. The determination of the thickness TH in step 906 may for example involves calculating absorbances and applying equations 1-4. Alternatively, look-up tables of absorbance values may be used. In step 908 the settings for the spin-coater are determined, based on the results of the determination step 906, and in step 910 these settings are applied to the spin-coater, so that the resist material layer L1 can be properly covered with the resist material layer L2 in accordance with the present invention. Next, the substrate is transported to the lithographic apparatus 71 (step 912) which again may involve the use of substrate handler and transporting devices. In the steps 914 the first exposure is executed in accordance with the present embodiment, and the first resist development process is applied in step 916. Similarly, in the steps 918 and 920 the second exposure and second resist development process are executed. The data 904 may further comprise sub-pattern overlay data and positioning data for reticles with the patterns SDL1 and SDL2 respectively. Therefore, these data shall be obtained and used in the steps 914 and 918 so that, during the second exposure, the second sub-pattern SDL2 is exposed in juxtaposed registry with respect to the first sub-pattern SDL1 (in accordance, for example, with FIG. 2) to provide a resist-mask patterned in accordance with the desired pattern as illustrated in FIG. 6. After execution of step 920, this resist pattern 600 is obtained.

A second embodiment of the invention is the same as the first embodiment of the invention described above, safe for the choice of resist material R2. In this embodiment, the resist material R2 is i-line resist, which just as KrF resist absorbs radiation of 193 nm wavelength. Alternatively, the resist material L2 comprises a positive tone resist different from i-line resist or KrF resist and with sufficient absorption for 193 nm radiation to provide an absorbance to the layer L2 in accordance with the present invention, and as described in the first embodiment.

A third embodiment of the invention is the same as the first embodiment of the invention described above, safe for the radiation source and for the choice of the resist materials R2 and R1 as combination. In this embodiment, the first resist material R1 is KrF resist, and the source SO a KrF excimer laser. The resist material R2 may for example be an i-line resist. Alternatively, the resist material L2 comprises a positive tone resist different from i-line resist and with sufficient absorption for 248 nm radiation to provide an absorbance to the layer L2 in accordance with the present invention, in analogy to the first embodiment.

Similarly, in a fourth embodiment of the invention the radiation source SO is an i-line mercury arc and the first resist material R1 is an i-line resist. The resist material R2 in the present embodiment is a positive tone resist with sufficient absorption for i-line radiation to provide an absorbance to the layer L2 in accordance with the present invention, in analogy to the first embodiment.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A method of exposing a lithographic substrate to radiation, said substrate having a first layer of a first positive tone developable material at least partially overlying the substrate and a second layer of a second positive tone developable material with a preselected absorbance for the radiation and at least partially overlying the first layer, comprising:

patterning the second layer with features of the second positive tone developable material in accordance with a first pattern of the radiation by:
exposing the second layer to the first pattern of the radiation, and developing the second positive tone developable material; and exposing the first layer and said features to a second pattern of the radiation whereby one or more areas of exposure of the second pattern include one or more of said features, and whereby between one or more pairs of adjacent features there is an area of exposure of the second pattern extending inward from the adjacent features and terminating at an unexposed area of the second pattern, and whereby during the respective exposures of the second and first layers said absorbance prevents exposure to above energy-to-clear exposure dose of at least a portion of the first positive tone developable material underneath exposed portions of the second positive tone developable material.

2. A method according to claim 1 wherein the first positive tone developable material is a positive tone resist material.

3. A method according to claim 1 wherein the first positive tone developable material is a first positive tone resist material and the second positive tone developable material is a second positive tone resist material.

4. A method according to claim 2 wherein the radiation is ArF excimer laser radiation and the resist material is a resist material for use with ArF excimer laser radiation.

5. A method according to claim 3 wherein the radiation is ArF excimer laser radiation and the first resist material is a resist material for use with ArF excimer laser radiation and whereby the second resist material is a resist material for use with i-line mercury arc radiation or a resist material for use with KrF excimer laser radiation.

6. A method according to claim 3 wherein the radiation is KrF excimer laser radiation and the first resist material is a resist material for use with KrF excimer laser radiation and the second resist material is a resist material for use with i-line mercury arc radiation.

7. A method according to claims 1 further comprising patterning the first layer by developing the first positive tone developable material.

8. A method according to claims 1 wherein the substrate comprises a target layer facing the first layer of developable material, and constructed and arranged to be lithographically patterned with a desired pattern comprising a first sub pattern and a second sub pattern, whereby the first and second pattern of the radiation correspond to an image of respectively the first and second sub pattern.

9. A method according to claim 8 whereby the image of the second sub pattern is arranged in juxtaposed registry with respect to the image of the first sub pattern on the substrate.

10. A method according to claim 8 whereby the first and second sub patterns are respectively a first and second pattern of lines and spaces.

11. A method according to claim 10 whereby lines of the second pattern of lines and spaces are arranged in interlaced position on the substrate with respect to the lines of the first pattern of lines and spaces.

\* \* \* \* \*